(12) United States Patent
Doris et al.

(10) Patent No.: US 7,741,181 B2
(45) Date of Patent: Jun. 22, 2010

(54) METHODS OF FORMING MIXED GATE CMOS WITH SINGLE POLY DEPOSITION

(75) Inventors: Bruce B. Doris, Brewster, NY (US); Charlotte DeWan Adams, Poughkeepsie, NY (US); Naim Moumen, Walden, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 209 days.

(21) Appl. No.: 11/936,061

(22) Filed: Nov. 6, 2007

(65) Prior Publication Data

US 2009/0114992 A1 May 7, 2009

(51) Int. Cl.
*H01L 21/8234* (2006.01)

(52) U.S. Cl. .............................. 438/275; 257/E21.623; 257/E21.625

(58) Field of Classification Search .................. 438/275; 257/E21.623, E21.625
See application file for complete search history.

(56) References Cited

U.S. PATENT DOCUMENTS

| 6,303,418 B1 | 10/2001 | Cha | 438/199 |
| 7,462,520 B2 * | 12/2008 | Park et al. | 438/151 |
| 2005/0153496 A1 * | 7/2005 | Ngo et al. | 438/197 |
| 2006/0199324 A1 | 9/2006 | Yu | 438/199 |

* cited by examiner

Primary Examiner—Kenneth A Parker
Assistant Examiner—Paul A Budd
(74) Attorney, Agent, or Firm—George Sai-Halasz; Louis J. Percello (57) ABSTRACT

A method for fabricating metal gate and polysilicon gate FET devices on the same chip is disclosed. The method avoids the use of two separate masks during gate stack fabrication of the differing gates. By using a single mask, tighter NFET to PFET distances can be achieved, and the fabrication process is simplified. After blanket disposing layers for the fabrication of the metal gate stack, a covering protective material layer is formed, again in blanket fashion. A block level mask is used to clear the surface for the gate insulator formation in the poly gate device regions. During oxidation, which forms the gate dielectric for the poly gate devices, the protective material prevents damage of the metal gate device regions. Following oxidation, a single common polysilicon cover is disposed in blanket manner for continuing the fabrication of the gate stacks. The protective material is selected in such a way to be either easily removable upon oxidation, or to be conductive upon oxidation. In this latter case the oxidized protective material is incorporated into the metal gate stack, which incorporation results in a novel CMOS structure.

8 Claims, 9 Drawing Sheets

METAL GATE        POLY GATE

FIG. 12

METHODS OF FORMING MIXED GATE CMOS WITH SINGLE POLY DEPOSITION

FIELD OF THE INVENTION

The present invention relates to electronic circuits and devices. In particular, it relates to methods of fabricating CMOS structures which contain both metal gate and polysilicon gate devices.

BACKGROUND OF THE INVENTION

Today's integrated circuits include a vast number of devices. Smaller devices and shrinking ground rules are the key to enhance performance and to reduce cost. As FET (Field-Effect-Transistor) devices are being scaled down, the technology becomes more complex, and changes in device structures and new fabrication methods are needed to maintain the expected performance enhancements alongside shrinking dimensions. The mainstay material of microelectronics is silicon (Si), or more broadly, Si based materials, or alloys. Such a Si alloy may be, for instance, silicon-germanium (SiGe). The devices in the embodiments of the present disclosure are typically part of the art of Si based material device technology.

There is great difficulty in maintaining performance improvements in FET devices of deeply submicron generations. Therefore, methods for improving performance without scaling down have become of interest. Such methods include the use of metal gates and the use of so called high-k dielectric gate insulators. Since there are many possible applications for electronic circuits, the need may arise for combining, or mixing, metal gate FET devices with the more traditional polysilicon gate devices. Such combinations have their own difficulties due to the differing processing requirements of the two differing type of gates. Better methods are needed for the fabrication of CMOS circuits containing both metal gate and polysilicon gate devices. Such methods may have significant commercial value, as well as, may enable better, tighter structures.

SUMMARY OF THE INVENTION

In view of the discussed difficulties, embodiments of the present invention disclose a method for processing a mixed gate CMOS structure. This method includes in a first type FET device the implementation of a first gate insulator, and the disposition over the first gate insulator a portion of the first gate stack. The portion of this first gate stack includes at least one metal layer. Next, the first gate insulator and the portion of the first gate stack are overlaid with a protective material. The method further includes, in a second type of FET device the implementation of a second gate insulator by performing an oxidation. Meanwhile, the protective material prevents damage to the first gate insulator and to the portion of the first gate stack during the oxidation.

Embodiments of the present invention further disclose a CMOS structure. The CMOS structure includes a first type FET device characterized as being a metal gate device. This first type FET device has a first gate stack, which first gate stack includes a polysilicon layer on top of an electrically conductive oxide layer. The polysilicon layer and the electrically conductive oxide layer are in direct physical contact. The CMOS structure further includes a second type FET device characterized as being a polysilicon gate device.

BRIEF DESCRIPTION OF THE DRAWINGS

These and other features of the present invention will become apparent from the accompanying detailed description and drawings, wherein.

DETAILED DESCRIPTION OF THE INVENTION

It is understood that Field Effect Transistor-s (FET) are well known in the electronic arts. Standard components of a FET are the source, the drain, the body in-between the source and the drain, and the gate. The body is usually part of a substrate, and it is often called substrate. For most circuits, and essentially for all high performance application, the body is a single crystal material. The gate is overlaying the body and is capable to induce a conducting channel in the body between the source and the drain. In the usual nomenclature, the channel is hosted by the body. The gate is separated from the body by the gate insulator, or gate dielectric. There are two type of FET devices: a hole conduction type, called PFET, and an electron conduction type, called NFET. Often, but not exclusively, PFET and NFET devices are wired into CMOS circuits. A CMOS circuit, or structure, contains at least one PFET and at least one NFET device. In manufacturing, or processing, when NFET and PFET devices are fabricated together on the same chip, one is dealing with CMOS processing and the fabrication of CMOS structures.

The traditional approach for fabricating gates of FET devices is that of using polysilicon as gate material. In the customary nomenclature one may use the simple term of "poly". Thus, the term "poly gate" device means an FET device which has a gate made essentially of polysilicon. There are many ways known in the art to implement poly gate FETs. Independently of the details of the specific approach, such FET devices are characterized as being polysilicon gate devices A common approach known in the art for fabricating gate insulators, also named gate dielectrics, is to oxidize the Si based body material. Often, the Si based body material is essentially pure Si. Oxidization of the body produces an oxide dielectric, which has the required properties for device operation. In advanced applications, when the gate insulator thickness is only a few nanometers, often less than 2 nm, the so called oxide gate dielectric may incorporate other elements besides oxygen, most notably, nitrogen. Although the stoichiometric composition of oxide is $SiO_2$, state of the art, so called oxide, gate insulators are often broadly defined oxynitride, SiON, compositions. However, the term of "oxide insulator", or dielectric, in state of the art FET device technology is meant to include all such material varieties. It means the insulator is thermally grown, in a primarily oxygen containing environment. Such a gate insulator is characterized as being an oxide gate insulator. The oxide insulators, although may not be composed purely of silicon and oxygen, typically would not contain materials characterized as being high-k materials.

In the microelectronics arts the mainstay approach is the use of FET devices which are characterized as being a polysilicon gate devices having gate insulators which are characterized as being oxide gate insulators.

The technology is progressing toward ever smaller device dimensions. Gate lengths of 45 nm are approaching mass production, and a 30 nm generation is on the drawing boards. Even shorter gate lengths are being contemplated for the future. For such ultra small FET devices a preferred fabricating approach may include the use of metal gates. A metal gate electrode has its advantages due to its high carrier concentration, which concentration leads to low gate resistance and high gate capacitance. There are many ways known in the art to implement metal, or more broadly metallic, gate FETs. Independently of the details of the specific approach, such FET devices are characterized as being metal gate devices.

There is a promising avenue in the art yielding higher gate dielectric capacitance without the need of making the gate dielectric physically thinner. This approach involves the use of so called high-k materials. The dielectric constant of such materials is higher than that of an oxide dielectric, which is about 3.9. A high-k material may physically be thicker than oxide, and still have a lower equivalent oxide thickness (EOT) value. The EOT, a concept known in the art, refers to the thickness of such an $SiO_2$ layer which has the same capacitance per unit area as the insulator layer in question. In today state of the art FET devices, one is aiming at an EOT of below 2 nm, and preferably below 1 nm. There are many ways known in the art to implement high-k gate insulators for FET devices. Independently of the details of the specific approach, such a gate insulator in general is characterized as being a high-k gate insulator.

Often, the approach to use metallic gates and the approach to use high-k gate insulators are applied together for FET devices. Some of the highest performing FET devices in the below 70 nm gate length generations are characterized as being both metallic gate, and high-k gate insulator devices.

In CMOS technology one may want to combine metal gate devices, and poly gate devices in the same circuits. For instance, one may use metal gate NFET devices and poly gate PFET devices. Such an approach would combine high performance with economy. In the past, one may have processed metal gate and poly gate devices for the same circuits, which, as far as fabrication technology is concerned, means on the same chip, by fabricating them essentially separately from one another. When work is progressing on the metal gate devices, the poly gate ones are masked for protection, and vice versa. There are benefits in reducing the number of masking steps from both a cost point of view, and from the view of improving alignment tolerances. In the approaching 45 nm and 30 nm gate length technologies, the NFET to PFET device separations are desired to be as tight as 100 nm and 70 nm, respectively. The traditional approach, with at least two masks for processing the layers from which the gates are defined, due to alignment tolerances may not allow such tight NFET to PFET device distances. Consequently, finding a way for using only one mask for processing the layers from which both the metal and polysilicon gates can be defined, would enable denser circuits, and would lead to cost savings due to simplicity.

If one is trying to save a masking step, in which the mask would have protected some devices while gate oxide was grown for other devices, a way has to be devised for substituting the protection that the mask afforded. This is possible if the devices which do not participate in gate oxide growth, typically the metal gate devices, are protected by a material with appropriate properties. Such appropriate properties may be that the material after being exposed to oxidation is either selectively removable with respect to the oxide dielectric, or, that after the oxidation it is electrically conductive, and consequently does not have to be removed.

Figure 1:
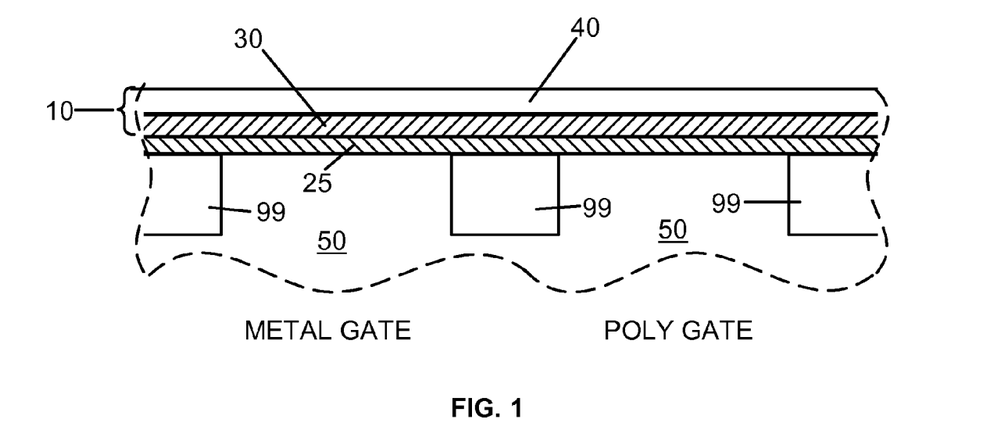
FIG. 1 shows the first gate insulator and a portion of the first gate stack.

FIG. 1 shows the first gate insulator and portion of a first gate stack. It is understood that in addition to the elements of the embodiments of the invention the figures may show additional elements, since they are standard components of FET devices, as known in the art. Such elements are shown for illustration purposes and not as limitations.

The device bodies 50 are typically of a single crystal Si based material. In a representative embodiment of the invention the Si based material bodies 50 are essentially single crystal Si. In exemplary embodiments of the invention the device bodies 50 are part of a substrate. The substrate may be any type known in the electronic art, such as bulk, or semiconductor on insulator (SOI), fully depleted, or partially depleted, FIN type, or any other kind. Also, substrates may have various wells of various conductivity types, in various nested positioning enclosing device bodies. The figure shows what typically may be only a small fraction of an electronic chip, such as a processor, as indicated by the wavy dashed line boundaries. The devices may be isolated from one another by any method known in the art. The figure shows a shallow trench 99 isolation scheme, as this is a typical advanced isolation technique available in the art.

The circuit section displayed in all the figures shows a location where two FET devices, a first device, one with a metal gate, and a second device with a polysilicon, or simply poly, gate are laid out next to one another, possibly at a minimal lithographically allowed distance. The regions for each of the devices are so indicated on the figures. The two regions are separated by an isolation structure 99.

FIG. 1 shows the state of CMOS processing when some layers, serving the purposes of the first device have already been formed. These layers have been implemented without masking, consequently cover all regions, including metal gate devices and also the regions for poly gate devices.

FIG. 1 shows that a layer for the first gate insulator 25 has already been implemented. In exemplary embodiments of the invention the first gate insulator 25 is characterized as being a high-k gate insulator. For illustration, the figures show the first gate insulator 25 as a single layer, however, it is understood that, as it is well known in the art, a high-k gate insulator may itself have a complicated layered structure. Typically high-k gate insulators may contain oxides such as $ZrO_2$, $HfO_2$, $Al_2O_3$, HfSiO, HfSiON, and others, and/or their admixtures. As known in the art, their common property is the possession of a larger dielectric constant than that of the standard oxide gate insulator material. However, the first gate insulator may not necessarily contain a high-k material. Details of the first gate insulator 25 structure are not significant for the embodiments of the invention, and any and all possible layers as the first gate insulator are within the scope of the embodiments of the invention.

In advanced technologies FET device gates are typically referred to as gate stacks, reflecting the fact usually they are multilayered structures. The gate stacks of FET devices that are characterized as being metal gate devices, besides one or more metal layers, usually include silicon portions as well, in the form of polycrystalline and/or in the form amorphous silicon. For illustration, and without the intent of limitation, the figures show two layers that after gate patterning will serve as a portion 10 of the first gate stack pertaining to the first device: a metal layer 30, and an amorphous silicon layer 40. It is understood that a more complicated multilayered structure could be implemented just as well.

There are many materials suitable serving as the at least one metal layer 30 in the portion 10 of the first gate stack. Such a material may be, without limitation: TaN, TiN, WN, W, Ta, Ru, Cr, Ta, Nb, V, Mn, Re, La, and others. It is understood that the portion 10 of the first gate stack may include further metallic layers as well. The amorphous Si layer 40 may be between about 10 nm and about 20 nm thick.

Figure 2:
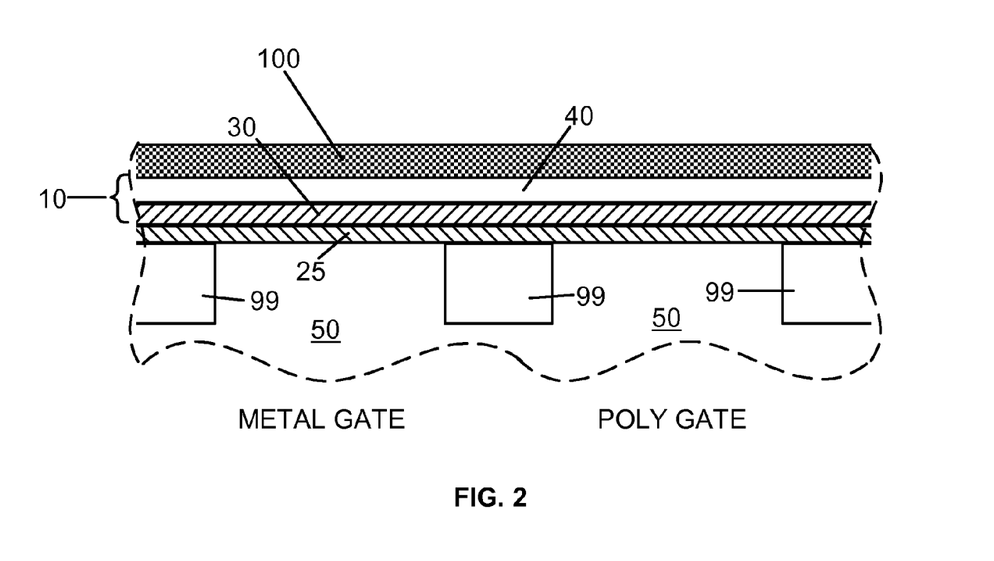
FIG. 2 shows the overlaid protective material.

FIG. 2 shows a protective material 100 overlaying the previously disposed layers. This protective material 100 layer also has been formed without masking, consequently it covers all regions over the earlier formed first gate insulator 25 and the first gate stack portion 10.

A purpose of the protective material 100 is to prevent damage to the first gate insulator 25 and to the first gate portion 10 during an oxidation forming the gate insulator of the poly gate device. The protective material 100 may need to possess advantageous properties. If, after oxidation the protective material 100 were electrically conductive, then it could stay in place and become part of the first gate stack, pertaining to the metal gated first device. Alternatively, after oxidation the protective material 100 may have to be removed. This removal preferably happens without masking, which means that the oxidized protective material 100 would have to be removable in a selective manner. The selectivity would be in reference to other layers found on the chip at the time of removal, primarily the oxide gate dielectric which has been grown for the poly gate device. But selectivity would be preferable against Si itself in various forms, and versus other dielectric materials, such as the isolation structures 99.

Figure 3:
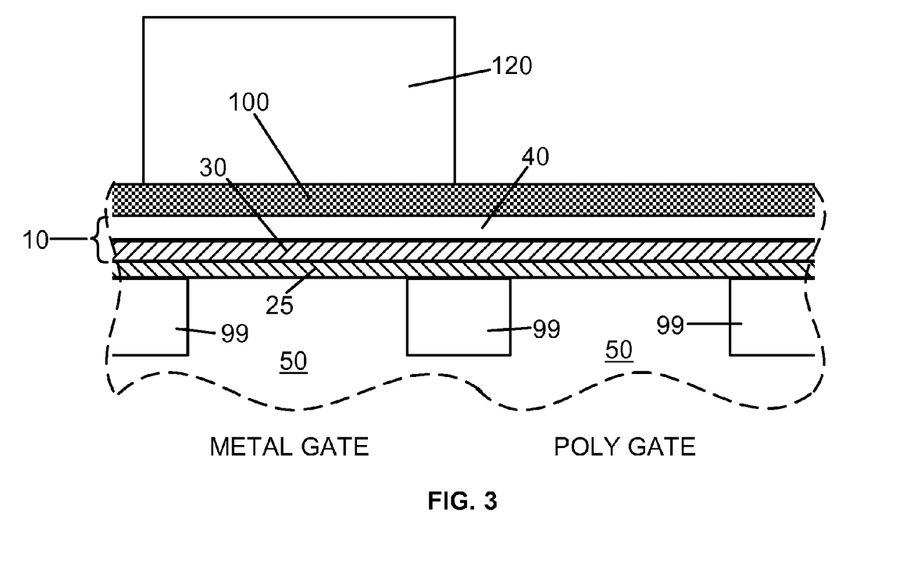
FIG. 3 shows masking of the metal gate regions.

FIG. 3 shows masking of the metal gate device regions. A block level mask 120 is implemented over the region of the first devices. This mask 120 is the only one in the embodiments of the invention which is used for processing the layers from which the two different type, namely the metal and the poly, gates will be defined. This is mask is lithographically produced, and its alignment has to be good enough only to the degree that the edges of the mask 120 fall over the isolation regions 99. These type of non-critically aligned masks are so called block level, indicting their relatively lax alignment requirements.

Figure 4:
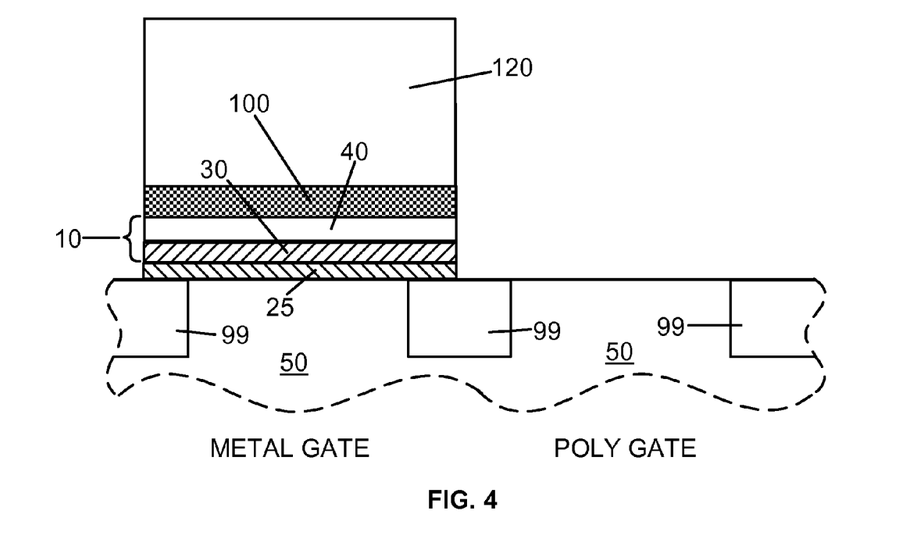
FIG. 4 shows exposing of the poly gate regions.

FIG. 4 shows the exposing of the poly gate device regions. The earlier formed layers serving the first type FET device, the first gate insulator 25, a portion 10 of the first gate stack, and the protective material 100, have been removed from the poly gate device regions, and the surface of the device body 50 has been cleaned and prepared for oxidation. Removal of the layers may follow well known methods of the art, such as reactive ion etching (RIE), or wet etching. Techniques for cleaning a surface in preparation for oxidation are also well known in the art.

Before implementing a second gate insulator by performing an oxidation, the layers underneath the protective material 100, may have to be protected from the sideways direction, as well. The side surfaces of the first gate insulator 25 and of the portion 10 of the first gate stack have been exposed at the same time that the exposing of the poly gate device regions occurred. It is possible that a damage during oxidation would not penetrate sideways far enough to cause problems for the metal gates. This is because only the middle section of the layers, about half way between the isolation structures 99, will end up in the final first gate. The presently exposed sides of the first gate insulator 25, the portion 10 of the first gate stack, and the protective material 100 will later be removed during the gate definition. Accordingly, some damage on the sides of the first gate insulator 25, the portion 10 of the first gate stack, and the protective material 100 is tolerable. Thus, in some embodiments of the invention one my proceed at this point to the oxidation as shown in FIG. 7. But, for embodiments where damage propagating laterally is of concern one may have to form sidewalls out of a covering material, as shown schematically on FIGS. 5 and 6.

Figure 5:
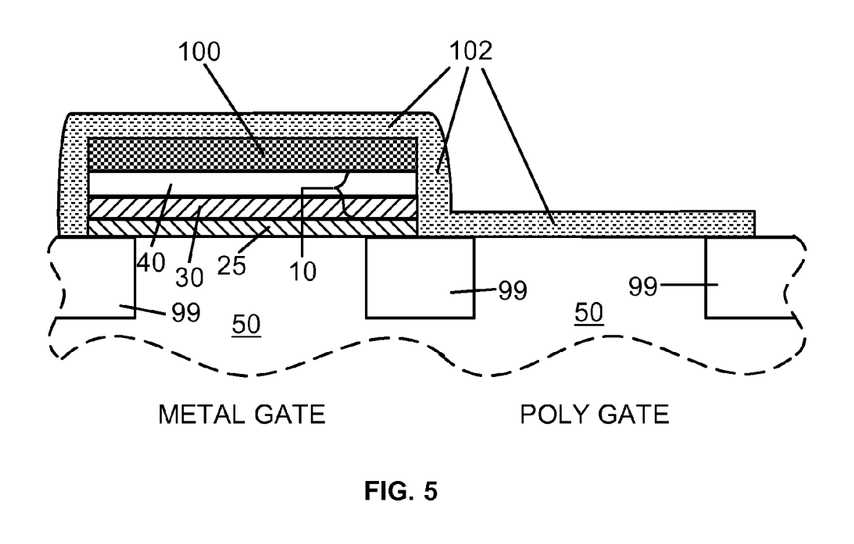
FIG. 5 shows the conformal deposition of a layer of covering material.

FIG. 5 shows the conformal deposition of a layer of a covering material. Fabrication of sidewalls may proceed by standard methods known in the art, exploiting conformal deposition and directional etching. Accordingly, a layer of a covering material 102 is conformally disposed without masking. Since conformality is used, that is, the deposition is not directional, the steps on the surface are covered over. The layer of the covering material 102 may be selected from a variety of materials. One requirement is, that one has to be able to selectively etch this covering material relative to the gate insulators. Such can be fulfilled for instance, with at nitride, or other materials well established in the art for sidewall formation. Or, one may use for the layer of the covering material 102 the same material as one used for protective material 100.

Figure 6:
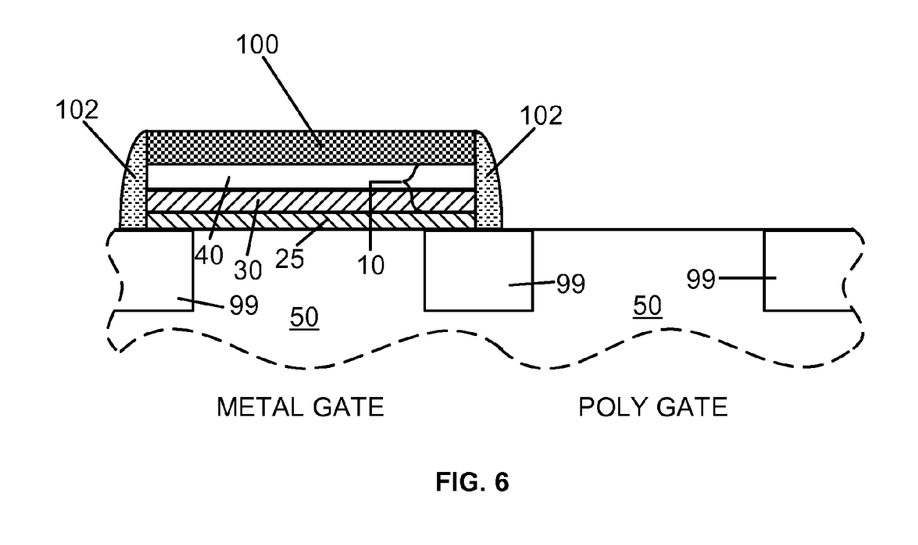
FIG. 6 shows protective sidewall formation.
Figure 7:
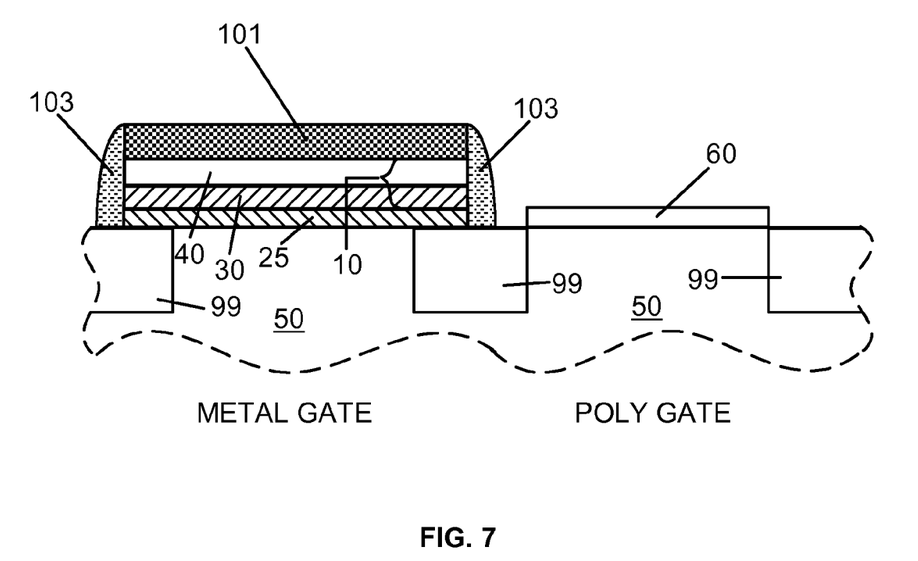
FIG. 7 shows the implementation of the second gate insulator by performing an oxidation.

FIG. 6 shows the covering material sidewall formation. In order to reach the stage shown in FIG. 6, the conformally deposited layer of covering material 102 has been removed from all the planar sections, typically with the use of RIE. As it is well known in the art, a directional etch following conformal disposition preserves sidewalls. The covering material 102 sidewall would guard against lateral damage.

FIG. 7 shows the implementation of the second gate insulator by performing an oxidation. For the second FET device, the one characterized as being a polysilicon gate device, the second gate insulator 60 has been formed by oxidation. Such an oxidation is a well developed art, and as discussed previously, it may involve not only oxygen but other materials, such as nitrogen, as well.

The protective material on the top 101 and, if needed, the covering material sidewalls 103, prevent damage to the first gate insulator 25 and to the first gate stack portion 10 during the oxidation. The indicator numbers for the layers of the protective and covering materials have been changed because the oxidation may have affected the original materials. As displayed on FIG. 7, the protective material layer 101 and the covering sidewall layer 103 may have been at least partially oxidized as compared to their "as formed" state.

As discussed earlier regarding selection as to the nature of the protective material 100, in one embodiment of the invention this protective material 100 may be selected to have an oxide 101 which is electrically conductive. In this case the electrically conductive oxide 101 may be left in place after the oxidation. Hence, the electrically conductive protective material oxide 101 would be incorporated into the first gate stack. Suitable material choices for this embodiment may be found amongst similar metals as the ones used for FET metal gate. Such choices include, for example, and without the intent of limitation: W, Ru, TiN, TaN, Ta, Mo, Cr, Ta, Nb, V, Mn, Re, La and their combinations. These metals may withstand the oxidation and protect the underlying layers, and their oxides are sufficiently conductive to be incorporated into a gate stack.

Figure 8:
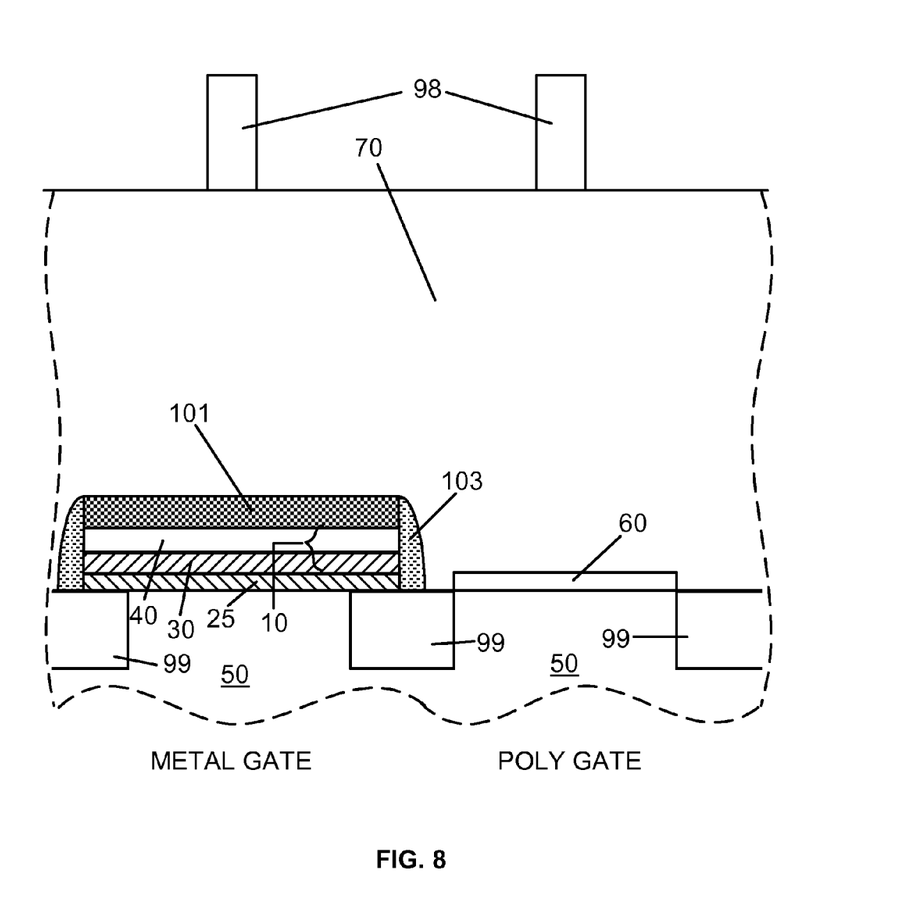
FIG. 8 shows polysilicon deposition and patterning for one embodiment of the invention.

FIG. 8 shows polysilicon deposition and patterning for one embodiment of the invention. After growing the second gate insulator 60, a single, common, blanket polysilicon 70 cover is disposed concomitantly over the first type FET device and over the second type FET device. This disposition may proceed by techniques known in the art. Such techniques may include, for example, various chemical vapor deposition (CVD) techniques. The oxidized protective material 101 and sidewall 103 remain in their places. This single common polysilicon 70 cover after patterning will form polysilicon layers in both the first, the metal, and the second, the poly, gate stacks. The term patterning means that some feature on the polysilicon 70 has to be defined by a masks 98, and the unwanted material has to be removed, typically by some etching technique. In this manner the blanket polysilicon 70 cover acquires a pattern.

Next, by some technique known in the art, for instance, by a standard lithographic techniques, or by a sidewall image technique, or by any other mean, masks 98 are being formed. These masks 98 define the final gate lengths.

Figure 9:
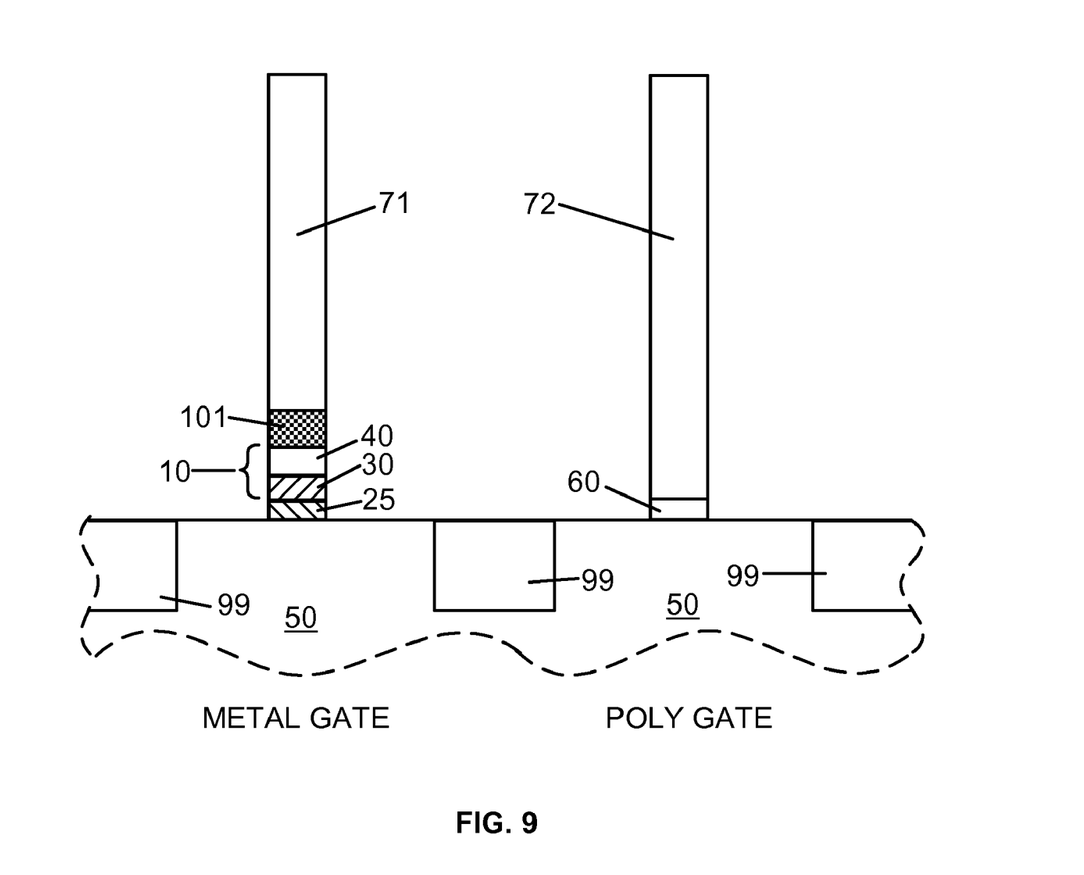
FIG. 9 shows the metal gate and polysilicon stacks in an embodiment of the invention.

FIG. 9 shows the metal gate and polysilicon stacks in an embodiment of the invention. After etching the single common polysilicon 70 by techniques known in the art, one obtains the polysilicon layer 71 in the first, the metal, gate, and the polysilicon layer 72 in the second, the poly, gate. Having finished with the polysilicon etching, the gates have been defined, and only a single block level mask 120 was used in processing the layers for both type of gates.

FIG. 9 also indicates an embodiment of a novel CMOS structure. A first type FET device, characterized as being a metal gate device, has a first gate stack. This first gate stack contains a polysilicon layer 71 on top of an electrically conductive oxide layer 101. The polysilicon layer 71 and the electrically conductive oxide layer 101 are in direct physical contact. The first gate insulator 25 is characterized as being a high-k gate insulator. The CMOS structure has a second type FET device which is characterized as being a polysilicon gate device. The second gate insulator is characterized as being an oxide gate insulator, with a polysilicon layer 72 covering an oxide gate dielectric 60.

In exemplary embodiments of the invention the first type FET device is an NFET device, and the second type FET device is a PFET device. In an alternate embodiment of the invention, the first type FET device is a PFET device, and the second type FET device is an NFET device.

Figure 10:
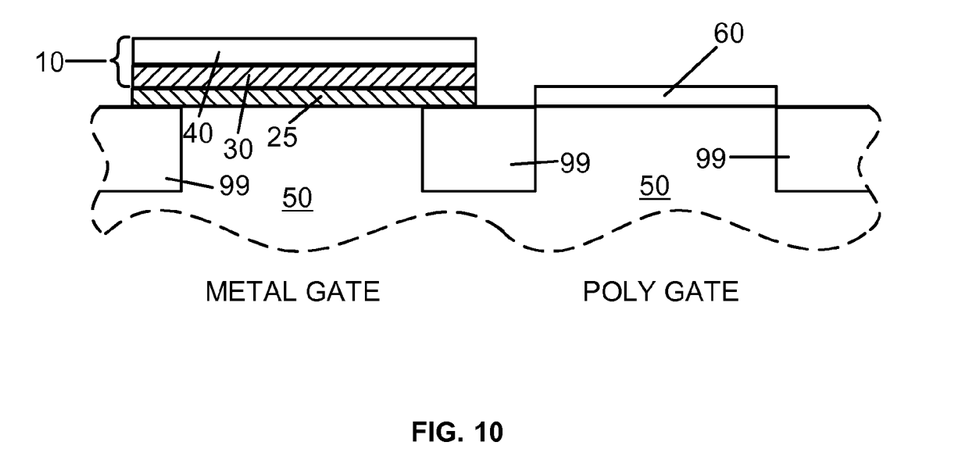
FIG. 10 shows stripping of the protective material for an alternate embodiment of the invention.

FIG. 10 shows stripping of the protective material for an alternate embodiment of the invention. As discussed earlier regarding selection as to the nature of the protective material 100, in an alternate embodiment of the invention this material 100 may be so selected to that the oxidized protective material 101 would be selectively removable. The selectivity would be with reference to other layers found on the chip at the time of removal, primarily the oxide gate dielectric 60 which has been grown for the poly gate device. But selectivity would be preferable against Si itself in various forms, and versus other dielectric materials, such as the isolation structures 99. For such an alternate embodiment the protective material 100 may be selected to be essentially pure Ge, or maybe SiGe with at least 70% atomic content Ge. Accordingly, in alternate embodiments of the present invention the protective material would be characterized as $Si_{1-x}Ge_x$, with x being $0.7 < x \leq 1$.

The state of the fabrication shown in FIG. 10 is similar to that shown in FIG. 7 for the conductive protective oxide material embodiment, except that the here the protective material top layer 101 and the sidewall 103 have been removed. If the sidewall material 103 is different than the oxidized protective material layer 101, then the removal of the sidewall at this stage is optional, since it can be removed later during the gate stack patterning.

It is well known in the electronics arts that the oxide of Ge is an easily removable material, which even sublimates by itself. But, in any case, the oxidized top layer of protective material 101, and if desired, the sidewall of covering material 103, can be removed without difficulty, as known in the art. For instance, the oxidized top layer of protective material 101 removal may involve the use of a water rinse, or a combination of a water rinse with an $NH_4OH$, $H_2O_2$ rinse, or a water rinse with an $HCl$, $H_2O_2$ rinse. These latter two are commonly referred to in the electronic arts as SC1 and SC2 cleanings. All of these have no effect on other exposed materials on the surface, such as the second, oxide, gate dielectric 60. From here on the processing continues along the same lines as previously discussed in connection with FIGS. 8 and 9.

Figure 11:
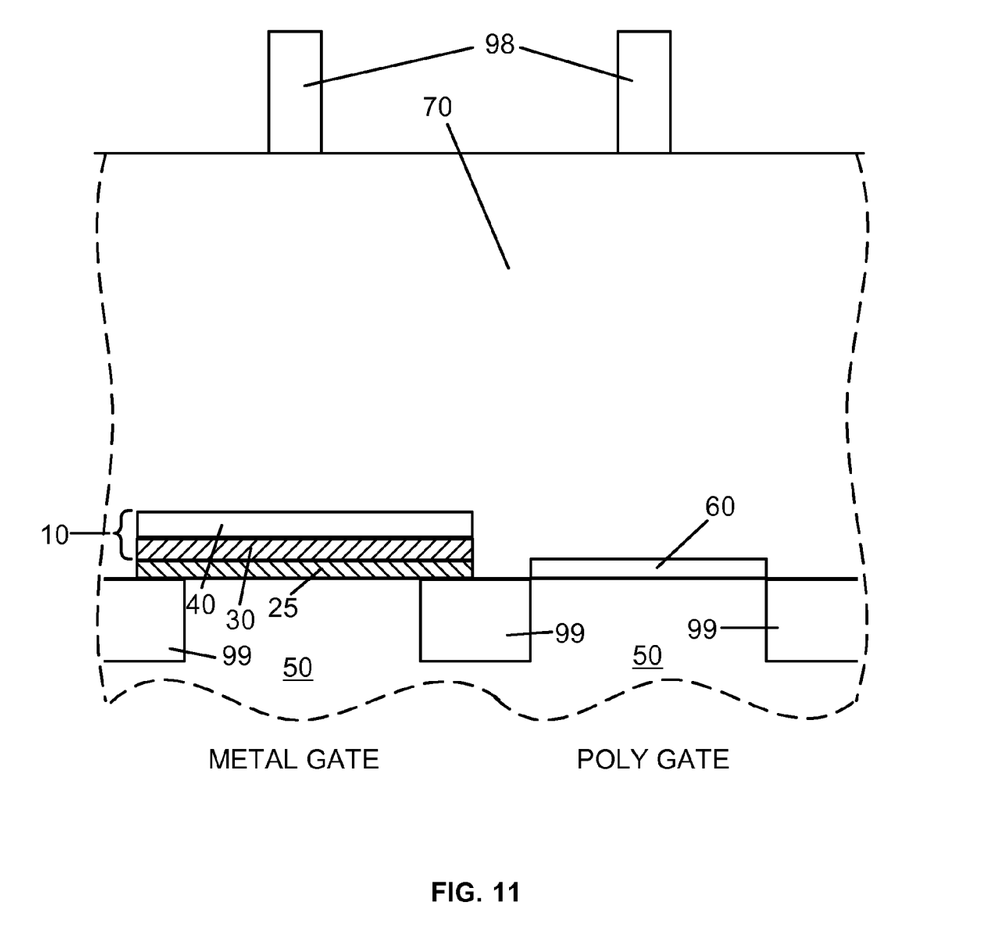
FIG. 11 shows polysilicon deposition and patterning for an alternate embodiment of the invention.

FIG. 11 shows polysilicon deposition and patterning for an alternate embodiment of the invention. After growing the second gate insulator 60, a single, common, blanket polysilicon 70 cover is disposed concomitantly over the first type FET device and over the second type FET device. This disposition may proceed by techniques known in the art. Such techniques may include, for example, various chemical vapor deposition (CVD) techniques. This single common polysilicon 70 cover after patterning will form polysilicon layers in both the first, the metal, and the second, the poly, gate stacks. The term patterning means that some feature on the polysilicon 70 has to be defined by a masks 98, and the unwanted material has to be removed, typically by some etching technique. In this manner the blanket polysilicon 70 cover acquires a pattern.

Next, by some technique known in the art, for instance, by a standard lithographic technique, or by a sidewall image technique, or by any other mean, masks 98 are being formed. These masks 98 define the final gate lengths.

Figure 12:
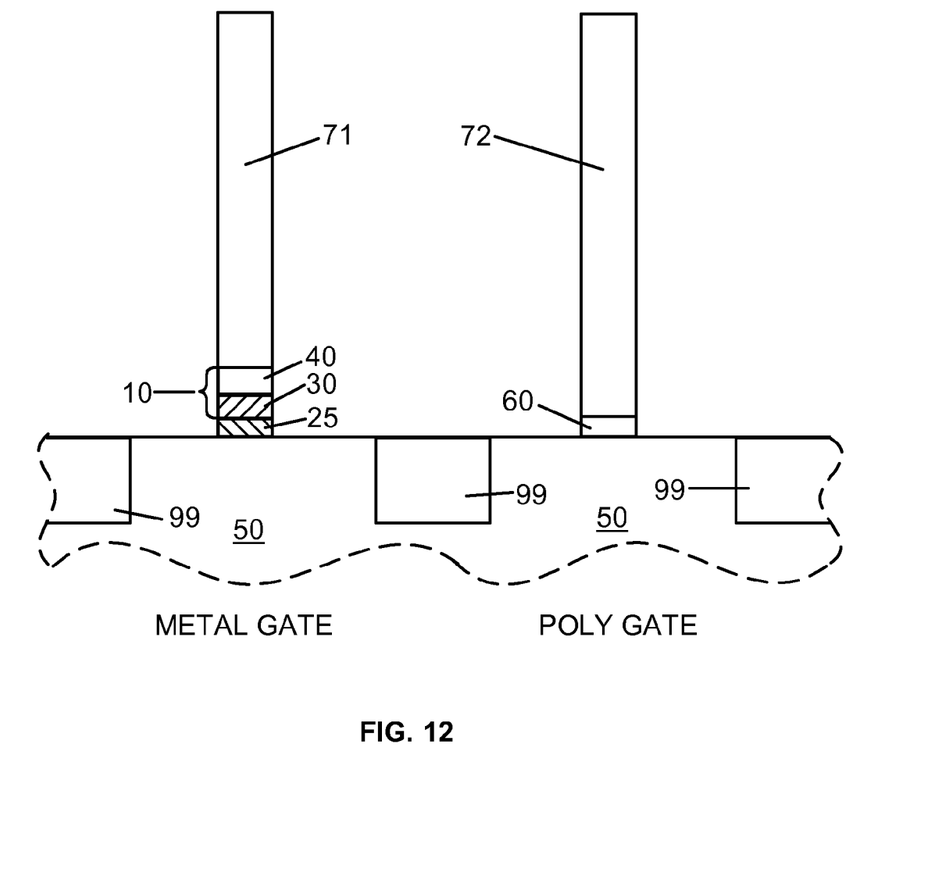
FIG. 12 shows the polysilicon and metal gate stacks in an alternate embodiment of the invention.

FIG. 12 shows the polysilicon and metal gate stacks for an alternate embodiment of the invention. After etching the single common polysilicon 70 by techniques known in the art, one obtains the polysilicon layer 71 in the first, the metal, gate, and the polysilicon layer 72 in the second, the poly, gate. Having finished with the polysilicon etching, the gates have been defined, and only a single block level mask 120 was used in processing the layers for both type of gates.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "under," "top", "side," "on", etc., as used herein refer to relative location and orientation of various portions of the structures with respect to one another, and are not intended to suggest that any particular absolute orientation with respect to external objects is necessary or required.

Benefits, other advantages, and solutions to problems have been described above with regard to specific embodiments.

However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art. The scope of the invention is defined by the appended claims.

We claim:

1. A method for processing a CMOS structure, comprising:
   in a first type FET device,
   implementing a first gate insulator;
   disposing over said first gate insulator a portion of a first gate stack, wherein said portion comprises at least one metal layer;
   overlaying said first gate insulator and said portion with a protective material;
   in a second type FET device,
   implementing a second gate insulator by performing an oxidation,
   wherein said protective material prevents damage to said first gate insulator and to said portion during said oxidation;
   disposing polysilicon concomitantly over said first type FET device and over said second type FET device; and patterning said polysilicon, wherein forming polysilicon layers for said first gate stack and for a second gate stack, wherein said second type FET device comprises said second gate stack.

2. The method of claim 1, wherein said overlaying of said protective material comprises forming a top layer and sidewalls of said protective material.

3. The method of claim 1, further comprising:
   forming sidewalls out of a covering material for said first gate insulator and for said portion of said first gate stack.

4. The method of claim 1, wherein said protective material is being selected in such manner as to have an oxide which is selectively removable with respect to said second gate insulator, wherein said selectively removable oxide is removed after said oxidation.

5. The method of claim 4, wherein said protective material is selected to be $Si_{1-x}Ge_x$, with x being $0.7 < x \leq 1$.

6. The method of claim 1, wherein said protective material is being selected in such manner as to have an oxide which is electrically conductive, wherein said electrically conductive oxide is left in place after said oxidation, whereby said electrically conductive oxide is included in said first gate stack.

7. The method of claim 1, wherein said first gate insulator is characterized as being a high-k gate insulator.

8. The method of claim 1, wherein said first type FET device is characterized as being a metal gate device, and said second type FET device is characterized as being a polysilicon gate device.

* * * * *